United States Patent [19]

Hopfner

[11] 3,997,831
[45] Dec. 14, 1976

[54] BATTERY CHECKER

[75] Inventor: Clemens Hopfner, Stuttgart-Wangen, Germany

[73] Assignee: Eastman Kodak Company, Rochester, N.Y.

[22] Filed: Oct. 16, 1975

[21] Appl. No.: 623,153

[30] Foreign Application Priority Data

Dec. 24, 1974 Germany .......................... 2461342

[52] U.S. Cl. .................................. 320/48; 320/13; 340/249
[51] Int. Cl.² .......................................... H02J 7/00
[58] Field of Search .............. 320/13, 48; 340/248, 340/249; 317/142 TD, 148.5; 307/141, 293, 10 BP

[56] References Cited

UNITED STATES PATENTS

| 3,211,964 | 10/1965 | Thorne | 317/151 |
| 3,621,276 | 11/1971 | Mitchell | 307/141 |
| 3,648,145 | 3/1972 | Meyer et al. | 320/13 |
| 3,831,081 | 8/1974 | Weiss | 320/13 X |
| 3,879,137 | 4/1975 | Sakazaki et al. | 356/218 |

FOREIGN PATENTS OR APPLICATIONS 1,338,256 11/1973 United Kingdom ................. 320/48

Primary Examiner—Robert J. Hickey
Attorney, Agent, or Firm—T. H. Close

[57] ABSTRACT

A battery checker for checking the condition of batteries under a simulated load includes a timer that automatically disconnects the load from the batteries a predetermined time after the check has commenced.

1 Claim, 1 Drawing Figure

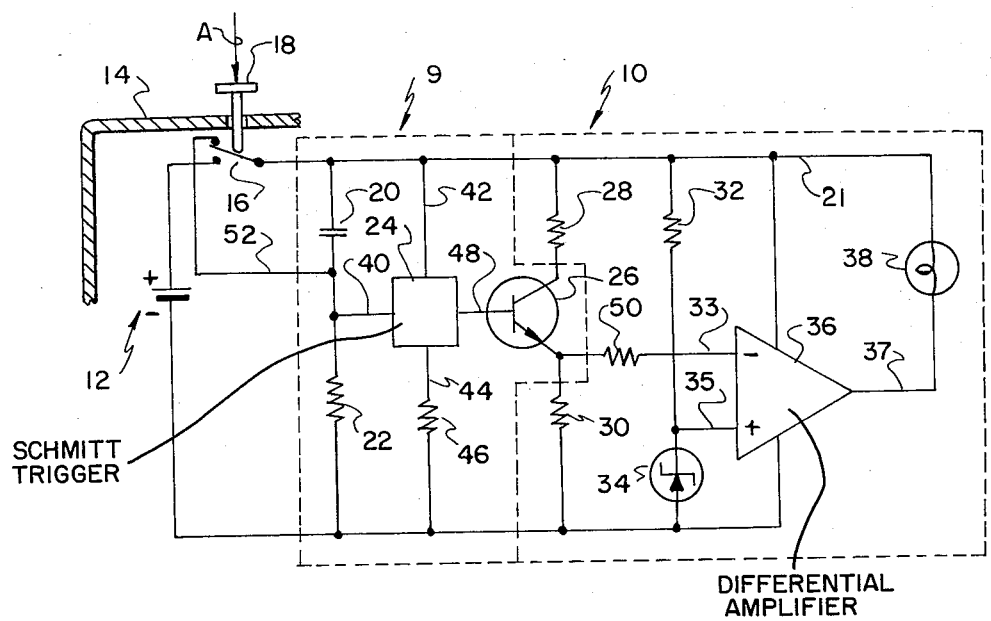

BATTERY CHECKER

BACKGROUND OF THE INVENTION

1. Field of the Invention

The present invention relates to battery checkers for checking the performance of batteries under simulated load. In particular it relates to a battery checker having an automatic timer for disconnecting the battery from the simulated load a predetermined length of time after the check has commenced.

2. Description of the Prior Art

It is well known to employ a battery checker for checking the condition of the batteries that power the motors and circuits in such portable apparatus as photographic cameras, movie cameras, tape recorders, etc. With the help of such a battery checker, the operator of the apparatus is able to tell whether the condition of the battery is adequate to power the apparatus for such operations as picture taking or sound recording without risking a malfunction or failure due to a weak battery.

A variety of battery checkers is known. Some of them indicate only the no-load voltage of the battery. Such an indication does not reveal sufficient information about the condition of the battery to predict whether the battery will perform satisfactorily under a load. Other battery checkers connect a load across the battery terminals during the checking procedure. The load simulates the actual load on the battery during operation of the apparatus so that a reliable prediction of the ability of the battery to successfully power the apparatus is obtained. The present invention relates to battery checkers wherein a simulated load is applied to the battery during checking.

A serious drawback to checking a battery under load results from the fact that the checking procedure itself may drain the battery and thereby reduce its efficiency so that finally, after repeated checking, the battery can no longer be used for its intended purpose, i.e., to power the apparatus in which it is located. Such excessive drain on a battery can result from unnecessarily frequent and/or prolonged checking of the battery by the user of the apparatus. This unnecessarily frequent and/or prolonged checking may result from an overabundance of concern on behalf of the user for the condition of the battery or merely as a result of the user amusing himself by activating the checking circuit.

In order to minimize any unnecessary drain on a battery, in a test instrument, it is known to employ a timing circuit in the test instrument to prevent the battery of the test instrument from being discharged if the main power switch is left on while the instrument is not in use (see U.S. Pat. No. 3,621,276 to Mitchell). Mitchell discloses a test instrument having a main power switch and a test switch which is momentarily closed to charge an R-C timing circuit. As long as the test switch is closed, power is applied to the test instrument. When the test switch is opened, power remains on the test instrument for a period of time determined by the R-C time constant of the R-C timing circuit. The timing circuit disclosed in the Mitchell patent does not protect against excessive drain on the instrument's battery due to prolonged closure of the test switch.

In a recently issued U.S. Pat. No. (3,879,137 to Sakazaki), an R-C timing circuit is disclosed and is purported to be effective to disconnect a battery from an exposure meter in a camera if the user should forget to open the test switch that applies power to the exposure meter. However, the circuit shown and described in the Sakazaki patent would be effective to disconnect power from the exposure meter only a predetermined time after the test switch is opened. If the test switch remains closed, the battery would continuously apply power to the exposure meter thus unnecessarily discharging the battery.

SUMMARY OF THE INVENTION

It is accordingly a primary object of the present invention to provide a battery checker that clearly indicates the condition of the battery under a test load but minimizes the drain on the battery even though the battery test switch is actuated continuously and/or repeatedly. In particular, it is an object of the present invention to provide a battery checker for checking the condition of a battery under a simulated load wherein the battery checker includes a timer that automatically disconnects the load from the battery a relatively short predetermined length of time after the check has commenced even though the test switch remains closed. Thus even if the battery checker is actuated repeatedly, the total time during which the test load is applied to the battery will be minimized.

According to a preferred embodiment of the invention, a timer for controlling the duration of the battery checking operation is connected between a battery checking circuit and the battery to be checked. The timer includes a transistor switch for connecting the battery to the battery checker and to a simulated load. The base of the transistor is connected to the output of a Schmitt trigger which controls the turning on and off of the transistor. An R-C timing circuit including a capacitor and a resistor connected in series is connected across the terminals of the battery and to the switching input of the Schmitt trigger.

When a check is commenced, the output of the Schmitt trigger causes the transistor to turn on for a time determined by the R-C time constant of the R-C timing circuit.

BRIEF DESCRIPTION OF THE DRAWING

The drawing shows the invention as incorporated in a battery checker in a battery operated apparatus.

DESCRIPTION OF THE PREFERRED EMBODIMENT

As shown in the drawing, the battery checker for checking a battery 12 is located within apparatus housing 14. The checker includes a test switch 16, an automatic timer 9 and a battery checking circuit 10. The automatic timer 9 includes an R-C timing circuit having a timing capacitor 20 and a timing resistor 22, a voltage sensitive switch such as a Schmitt trigger 24, and a transistor 26. The battery checking circuit includes first and second load simulating resistors 28 and 30, a reference voltage generating section having a resistor 32 and a Zener diode 34, a differential amplifier 36, and an indicator such as lamp 38.

The test switch 16 is a single pole double throw switch that is mechanically connected to a test button 18 and is movable between a first position as shown to a second position wherein the switch electrically connects the positive terminal of battery 12 to conductor 21. The R-C timing circuit including a series arrangement of capacitor 20 and resistor 22 is connected between conductor 21 and the negative terminal of battery 12. Schmitt trigger 24 has a switching input 40 that is electrically connected to the junction between timing capacitor 20 and timing resistor 22. The Schmitt trigger 24 is supplied power from the positive side of the battery via conductor 42 which is connected to conductor 21. The Schmitt trigger 24 has a threshold setting input 44 that is connected to the negative terminal of the battery through resistor 46. The Schmitt trigger 24 also has an output 48 which is connected to the base of transistor 26. When the voltage on the switching input 40 of Schmitt trigger 24 exceeds a predetermined threshold voltage, the voltage at the output 48 will have a relatively high value sufficient to bias transistor 26 ON. When the voltage on the switching input 40 drops below the threshold voltage, the voltage at the output 48 will drop to a relatively low value turning OFF transistor 26. The collector of transistor 26 is connected to conductor 21 through first load simulating resistor 28. The emitter of transistor 26 is connected to the negative terminal of the battery through second load simulating resistor 30.

Differential amplifier 36 has an inverting input terminal 33 which is connected through resistor 50 to the junction between the emitter of transistor 26 and resistor 30. The reference voltage generating circuit including the serial connection of resistor 32 and Zener diode 34 is connected between conductor 21 and the negative terminal of the battery. Differential amplifier 36 has a non-inverting terminal 35 which is connected to the junction between resistor 32 and Zener diode 34. Indicator lamp 38 is connected between conductor 21 and the output terminal 37 of differential amplifier 36.

When test button 18 is in its first position as shown, there is a short circuit across capacitor 20 via conductor 52 and the battery checking circuit is disconnected from the positive terminal of battery 12. When the test button 18 is moved in the direction of arrow A, test switch 16 is moved to its second position thereby removing the short circuit on capacitor 20 and connecting the positive terminal of the battery to the battery checking circuit 10 via conductor 21. Immediately upon movement of switch 16 to its second position, capacitor 20 is in its discharged state and the voltage on input 40 of Schmitt trigger 24 is equal to the positive voltage of the battery. At this point, the voltage on switching input 40 of the Schmitt trigger 24 is greater than that required to turn the Schmitt trigger on, and a positive voltage is applied to the output terminal 48 thereby turning on transistor 26 and connecting first and second load simulating resistors 28 and 30 located in the collector to emitter circuit of transistor 26 across the battery. The load simulating resistors put a load on battery 12 comparable to that encountered by the battery when it is supplying power to the apparatus. The "measured voltage" at the junction between the emitter of transistor 26 and load resistor 30 will be dependent upon the condition of battery 12. The "reference voltage", however, at the junction between resistor 32 and Zener diode 34 will be a constant as long as there is some life left in the battery. If the measured voltage is higher than the reference voltage, the differential amplifier will produce a low voltage on its output 37 causing indicator lamp 38 to light up. The lighting of lamp 38 indicates to the user of the apparatus that the condition of battery 12 is sufficient to power the apparatus. If the measured voltage is lower than or equal to the reference voltage, the differential amplifier will produce a positive voltage at its output and indicator lamp 38 will not light up, thereby indicating that the condition of the battery 12 is no longer sufficient to operate the apparatus satisfactorily.

As capacitor 20 charges through resistor 22, the voltage on switching input 40 of the Schmitt trigger decreases. At the point where the voltage on the switching input 40 of Schmitt trigger 24 drops below the switching threshold voltage, the voltage on output 48 of Schmitt trigger 24 will drop, thereby turning off transistor 26 to disconnect first and second load simulating resistors 28 and 29 from the battery, and terminate the battery checking period even if switch 16 remains in its second position. It will be noted that as long as switch 16 remains closed after the checking period has elapsed, some small idle current will continue to be drawn by Schmitt trigger 24, the reference voltage generating section, and differential amplifier 36. This idle current, however, is insignificant compared to the current drawn by the load simulating resistors 28 and 30 when they are connected to the circuit.

If switch 16 is moved from its second position to its first position during the checking period, the check will also thereby be terminated. The R-C time constant of capacitor 20 and resistor 22 is chosen to be on the order of one second so that a reliable indication of the battery condition can be made without undue drain on the battery. The R-C time constant can be made to be variable if resistor 22 is of the variable type and can be adjusted by the operator of the apparatus.

The invention has been described in detail with particular reference to a preferred embodiment thereof, but it will be understood that variations and modifications can be effected within the spirit and scope of the invention.

I claim:

1. A battery checker for use in apparatus having a battery for supplying power to a load, comprising:
   1. a battery checking circuit having
      a. means for simulating the load on the battery, and
      b. means for indicating the condition of the battery under the simulated load;
   2. a test switch movable between first and second positions; and
   3. timing means coupled to said test switch and responsive to movement of said test switch from said first position to said second position for electrically connecting said load simulating means to the battery and after a predetermined time if said test switch remains in said second position for disconnecting said load simulating means from the battery, said timing means including,
      a. an R-C timing circuit having a timing capacitor and a timing resistor connected in series,
      b. a voltage sensitive switch having a switching input and an output, said switching input being connected to the connection between said timing capacitor and said timing resistor, and
      c. a transistor having a base, an emitter and a collector, the base of said transistor being connected to the output of said voltage sensitive switch, and said test switch being connected to said R-C timing circuit so that when said test switch is in said first position, said timing capacitor is discharged therethrough and when said test switch is in said second position, the battery is electrically connected to said battery checking circuit and said timing means therethrough.

* * * * *